United States Patent [19]

Duensing et al.

[11] Patent Number: 5,049,821
[45] Date of Patent: Sep. 17, 1991

[54] CONTINUOUSLY VARIABLE FIELD OF VIEW SURFACE COIL FOR NMR IMAGING

[75] Inventors: George R. Duensing; Jeffrey R. Fitzsimmons, both of Gainesville; Don Sanford, Hawthorne, all of Fla.

[73] Assignee: University of Florida, Gainesville, Fla.

[21] Appl. No.: 479,684

[22] Filed: Feb. 15, 1990

[51] Int. Cl.[5] ............................................. G01R 33/20
[52] U.S. Cl. ...................................... 324/322; 324/318; 335/219
[58] Field of Search ............... 324/300, 307, 309, 310, 324/311, 312, 313, 314, 318, 322; 128/653 A; 335/219, 250

[56] References Cited

U.S. PATENT DOCUMENTS

| | | | |
|---|---|---|---|
| 4,590,427 | 5/1986 | Fukushima | 324/311 |
| 4,782,298 | 11/1988 | Arakawa et al. | 324/318 |
| 4,784,146 | 11/1988 | Mancuso et al. | 324/318 |
| 4,841,248 | 6/1989 | Mehdizadeh | 324/318 |

Primary Examiner—Michael J. Tokar
Attorney, Agent, or Firm—Kerkam, Stowell, Kondracki & Clarke

[57] ABSTRACT

An NMR radio frequency (RF) surface coil allows the user to continuously vary the size of the field of view. The surface coil utilizes a modified radio frequency trombone for size adjustment that results in a stable resonant frequency of the coil over a wide range of dimensions such that retuning of the coil is unnecessary with changes in dimensions and variation of the field of view. The coil may be increased in area by as much as 60 percent while maintaining frequency stability to 1 MHz at 63.5 MHz and 2 MHz for full extension of 10 cm. The coil is readily adapted for imaging of the human spine, but can also be utilized for imaging other anatomical features.

15 Claims, 4 Drawing Sheets

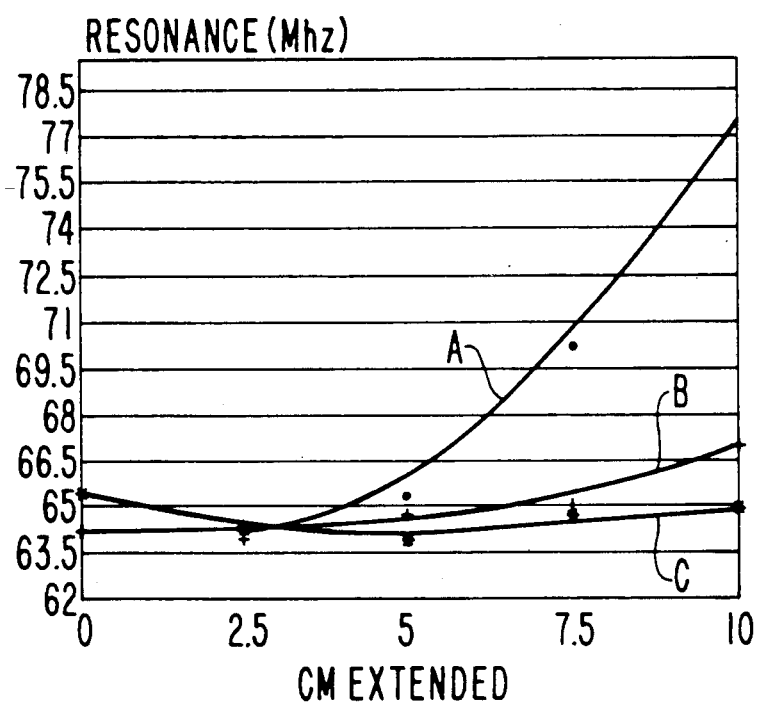

CONTINUOUSLY VARIABLE FIELD OF VIEW SURFACE COIL FOR NMR IMAGING

Research leading to the completion of the invention described herein was conducted under a grant by NIH under Grant No. P41 RR02278.

The U.S. Government has certain rights in and to the invention described herein.

BACKGROUND OF THE INVENTION

1. Field of the Invention

This invention relates to nuclear magnetic resonance (NMR) apparatus. More specifically, this invention relates to radio frequency (RF) coils useful with such apparatus for transmitting and/or receiving RF signals.

2. Description of the Prior Art

In the past, the NMR phenomenon has been utilized by structural chemists to study, in vitro, the molecular structure of organic molecules. Typically, NMR spectrometers utilized for this purpose were designed to accommodate relatively small samples of the substance to be studied. More recently, however, NMR has been developed into an imaging modality utilized to obtain images of anatomical features of live human subjects, for example, the orbits, TMJ, neck, spine, heart and extremities. Such images depicting parameters associated with nuclear spins (typically hydrogen protons associated with water in tissue) may be of medical diagnostic value in determining the state of health of tissue in the region examined. NMR techniques have also been extended to in vivo spectroscopy of such elements as phosphorus and carbon, for example, providing researchers with the tools, for the first time, to study chemical processes in a living organism. The use of NMR to produce images and spectroscopic studies of the human body has necessitated the use of specifically designed system components, such as the magnet, gradient and RF coils.

By way of background, the nuclear magnetic resonance on occurs in atomic nuclei having an odd number of protons and/or neutrons. Due to the spin of the protons and neutrons, each such nucleus exhibits a magnetic moment, such that, when a sample composed of such nuclei is placed in a static, homogeneous magnetic field, $B_o$, a greater number of nuclear-magnetic moments align with the field to produce a net macroscopic magnetization M in the direction of the field. Under the influence of the magnetic field $B_o$, the magnetic moments precess about the axis of the field at a frequency which is dependent on the strength of the applied magnetic field and on the characteristics of the nuclei. The angular precession frequency, $\omega$, also referred to as the Larmor Frequency, is given by the equation $\omega = \gamma B$, in which $\gamma$ is the gyromagnetic ratio (which is constant for each NMR isotope) and wherein B is the magnetic field ($B_o$ plus other fields) acting upon the nuclear spins. It will be thus apparent that the resonant frequency is dependent on the strength of the magnetic field in which the sample is positioned.

The orientation of magnetization M, normally directed along the magnetic field $B_o$, may be perturbed by the application of magnetic fields oscillating at or near the Larmor frequency. Typically, such magnetic fields designated $B_1$ are applied orthogonal to the direction of magnetization M by means of radio-frequency pulses through a coil connected to radio-frequency-transmitting apparatus. Magnetization M rotates about the direction of the $B_1$ field. In NMR, it is typically desired to apply RF pulses of sufficient magnitude and duration to rotate magnetization M into a plane perpendicular to the direction of the $B_o$ field. This plane is commonly referred to as the transverse plane. Upon cessation of the RF excitation, the nuclear moments rotated into the transverse plane begin to realign with the $B_o$ field by a variety of physical processes. During this realignment process, the nuclear moments emit radio-frequency signals, termed the NMR signals, which are characteristic of the magnetic field and of the particular chemical environment in which the nuclei are situated. The same or a second RF coil may be used to receive the signals emitted from the nuclei. In NMR imaging applications, the NMR signals are observed in the presence of magnetic-field gradients which are utilized to encode spatial information into the NRM signal. This information is later used to reconstruct images of the object studied in a manner well known to those skilled in the art.

In performing NMR studies, it has been found advantageous to use a high homogeneous magnetic field $B_o$. This is desirable in the case of proton imaging to improve the signal-to-noise ratio of the NMR signals. In the case of spectroscopy, however, this is a necessity, since some of the chemical species studied (e.g., phosphorus and carbon) are relatively scarce in the body, so that a high magnetic field is necessary in order to detect usable signals. As is evident from the Larmor equation, the increase in magnetic field B is accompanied by a corresponding increase in $\omega$ and, hence, in the resonant frequency of the transmitter and receiver coils. This complicates the design of RF coils. One source of difficulty is that the RF field generated by the coil must be homogeneous over the body region to be studied. Another complication arises from the intrinsic distributed inductance and capacitance in such large coils which limit the highest frequency at which the coil can be made to resonate.

For high resolution magnetic resonance imaging (MRI) of the human body, it is desirable to optimize the signal to noise ratio (SNR) of the received signals. This requires that the size and shape of the receiver surface coil provide an optimum filling factor given the organ of interest. Small RF coils provide larger $B_1$ fields per unit current, while presenting a smaller surface area to the load. The reduction in the surface area of the load results in less degradation of the coil circuit Q, reducing coil losses.

As previously noted, popular regions of interest for surface coils include the orbits, TMJ, neck, spine, heart and extremities. A number of different geometries with varying degrees of performance have been proposed to optimize SNR for each of these regions of interest. The spinal area presents a particular challenge to coil designers because the clinician would like to vary the field of view of the area as well as survey the entire spine as well as for other body areas in a single acquisition and at the same time obtain the highest possible SNR for high in-plane resolution from thin slices. The result is that surface coils for the spine are often a compromise between field of view and high performance.

Attempts have been made to solve this problem by constructing coils which either can be repositioned or which have sets of elements which can be switched into place to change the field of view. Repositioning devices can be very effective and easy to use because there is no need to reposition the patient. The coil simply moves in a space created between the patient and the table, but this requires a machine of special construction. The use of multi-element coils, however, is limited by the number of sections which can be effectively switched. In addition, such switching requires PIN diodes at each junction, which may reduce the efficiency of the design by reducing the coil Q.

Another approach to the problem is to construct an array of coils which have no mutual inductance and to couple each coil to a separate pre-amplifier, phase detector and combiner (14). This approach is effective, however, it requires additional expensive electronics not available to most sites without extensive redesign by the manufacturer.

Probes or RF coils are also typically constructed of fixed dimensions and designed for the region to be examined. Inasmuch as the same region of interest may vary greatly in size for different patients such coils are limited in their use and application. Also, it is desirable to obtain images of a broad scope for some regions and then image a smaller, more specific area which cannot be done practically with a fixed dimension coil.

It is therefore an object of the invention to provide a flexible, efficient, low-cost solution to the problem of varying the field of view.

Another object of the invention is to provide an NMR RF coil that is variable in size, but which remains electrically stable during adjustment.

A further object of the invention is to provide an NMR RF coil which can be readily and efficiently tuned to allow variation of the field of view of an NMR image.

SUMMARY OF THE INVENTION

In accordance with the present invention an NMR radio frequency-surface coil includes a self-compensating trombone which can be adjusted in size with no net change of impedance (tuning in the NMR probe) and results in a stable frequency over a wide range of dimensions. The invention is particularly adapted for imaging of the human spine and other anatomical features.

BRIEF DESCRIPTION OF THE DRAWINGS

The features of the invention believed to be novel are set forth with particularity in the appended claims. The invention itself however, both as to the structure and method of operation, together with further objects and advantages, may best be understood and appreciated by reference to the following description, taken in conjunction with the accompanying drawings in which:

FIG. 3 comprises two figures, FIG. 3a and FIG. 3b.

FIG. 9 is a graph illustrating empirical data showing the change of resonant frequency with amount of extension for various coil embodiments constructed in accordance with the present invention.

DESCRIPTION OF THE PREFERRED EMBODIMENTS

Figure 1:
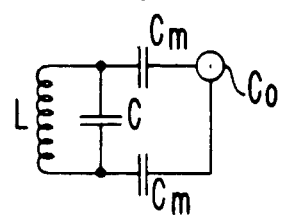
FIG. 1 is an equivalent electrical diagram of a typical NMR probe.

A typical circuit model NMR probe is shown in its electrical schematic equivalent in FIG. 1. The inductance, represented by L, is the coil element which receives the NMR signal. The value of L is dependent upon the size and geometry of the coil. Such a probe is sensitive to one particular frequency given by:

$$f = 1/(2\pi(LC)^{\frac{1}{2}}) \quad (1)$$

where f is the resonant frequency, L is the inductance and C is the capacitance. For best performance, the coil impedance is matched at the frequency of the 50 ohm coaxial line Co typically using matching capacitors $C_m$.

The resonant frequency is determined by the inductance and capacitance of the coil which are in turn determined by the dimensions and geometry of the coil. A change of the coil dimensions will in general change the resonant frequency which leads to either a decrease in performance or increased time of experiment to retune the coil. Therefore to allow a variable field of view, compensation of the inductance and or capacitance must be implemented to hold the frequency of resonance constant. In accordance with the present invention, changes in impedance due to a change in shape or dimensions are automatically compensated for thereby keeping the frequency of interest approximately constant so that retuning is not necessary. To this end, the NMR probe of the present invention has continuously variable dimensions over a certain frequency range and remains tuned during adjustments of its size.

Figure 2:
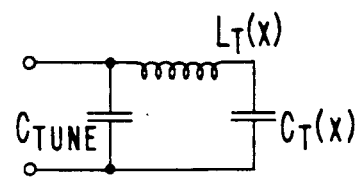
FIG. 2 is a general equivalent electrical diagram of a circuit model of a coil constructed in accordance with the present invention.

FIG. 2 shows a circuit model of a coil which has impedances which vary with position or size adjustment and which does not have matching capacitors. For constant tuning, the equivalent inductance $L_{eq}$ must be a constant, where $$\omega L_{eq} = \omega L_T(x) - 1/\omega C_T(x) \text{ and} \quad (2)$$

$$\omega/(2\pi) = f = 1/(2\omega(L_{eq}C_{Tune})^{\frac{1}{2}}) \quad (3)$$

$C_T(x)$ and $L_T(x)$ represent the total capacitance and total inductance, respectively as a function of adjustment or variation in coil size due to extension of a conductive leg. Capacitance $C_{(x)}$ is maximum with the leg fully inserted, i.e., x approaches or is equal to zero (0).

In accordance with the present invention, the surface coil of the present invention utilizes coaxial tubular conductors separated by a dielectric and arranged such that the conductors slide over each in a trombone effect.

The coil is preferably rectangular in shape. Cooperating coaxial legs of the coil include slidable impedance adjustment segments or elements. By varying the spacing and dielectric material between the conductors and/or by adding layers of conducting sheets of selected shapes between dielectric layers, the resonant frequency of the coil is kept substantially constant with lengthwise adjustment of the coil and varies very little as the tubular conductors are caused to slide over one another when extended or contracted. The impedance may also be controlled during adjustment by using a shaped conductive layer to cause an impedance change that satisfies the constraints of the equation (2). The cross section of the coil segment where the sliding segment takes place is arbitrary.

Figure 3A:
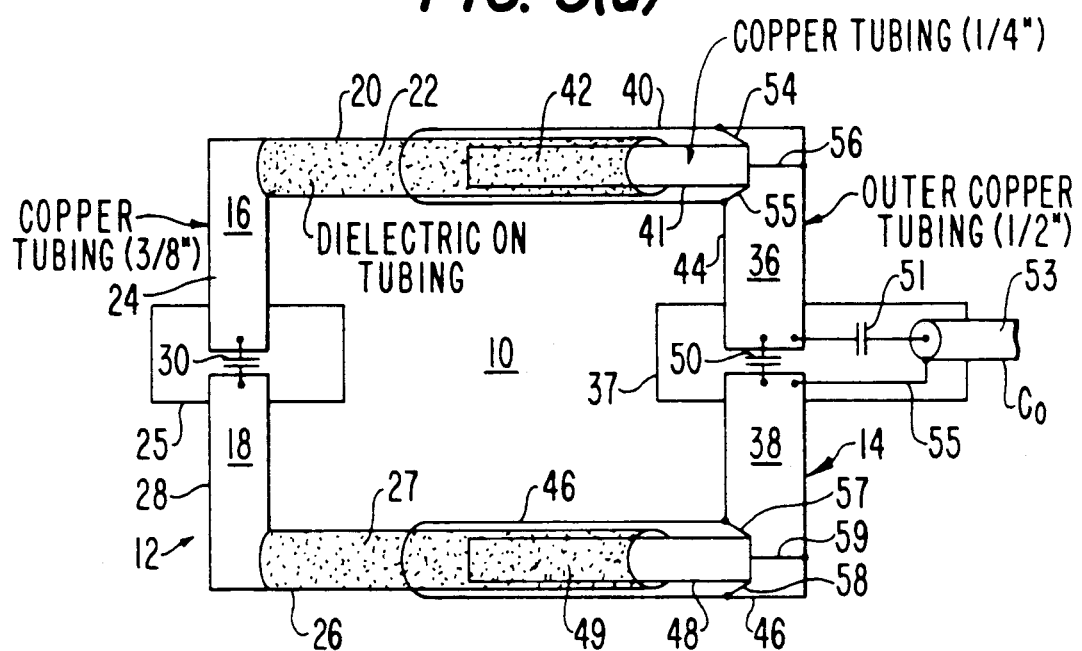
FIG. 3a is a diagrammatic representation of an adjustable length coil using three (3) coaxial conductors.
Figure 3B:
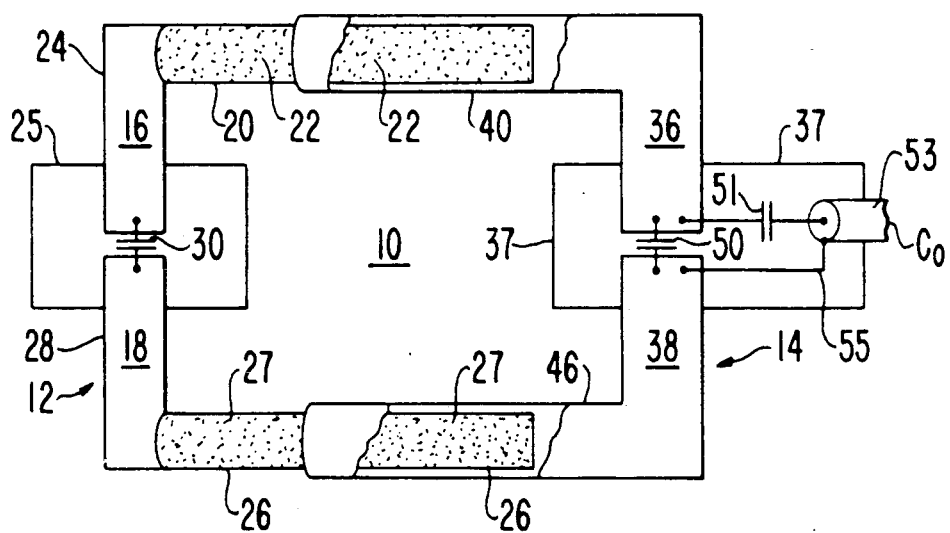
FIG. 3b is a diagrammatic representation of an adjustable coil using two coaxial tubular conductors and wherein a position of the outer tube has been removed for clarity.

In its simplest form, the subject invention employs a pair of coaxial tubular conductors which are telescopingly arranged such that the size of the surface coil may be varied as shown for example in FIG. 3b. Coil lo comprises two sections 12 and 14 each of which include a pair of tubular leg members 20, 26 and 40, 46. One pair of the leg members, legs 40, 46, for example, are larger in diameter than the other pair of leg members 20, 26 such that the latter are slidingly received within legs 40, 46. Legs 20, 26 are provided with a layer of dielectric 22 and 27 respectively. The two sections are arranged to form a rectangular coil as shown in FIG. 3 with the legs of each pair in a section being electrically joined by capacitors 30 and 50. Mechanical support for the adjacent legs of each pair may be conveniently provided by substrates 25 and 37 to which the leg members are joined by welding or the like. The substrates provide a convenient support for mounting capacitors 30, 50 and 51 and coaxial line $C_o$. Capacitor 51 is connected to the central conductor of coaxial line $C_o$ and a suitable ground connection is established between shield 53 and leg 38 of the coil via conductor 55.

In operation, section 12 is adjustably positioned by withdrawing legs 20 and 26 from within the larger legs 40, 46. This results in a decrease in capacitance of the system and a consequent increase in resonant frequency. For linear extensions up to 5 cms., the resonant frequency remains substantially constant, but for greater axial displacement, the change in resonant frequency rises rapidly.

It is known to use a trombone to effect changes in impedance by varying the relationship of coaxial members. Such a procedure is disclosed for example in the article of I. S. McKenzie, P. R. Cole, E. M. Robinson and B. Wood, *A Trombone Tuned Birdcage Resonator for H and F NMR Imaging At 4.7T.* 7th Annual meeting of the SMRM, page 856, 1988. However, the McKenzie et al article relates to a bird cage resonator wherein the limbs are constructed to incorporate coaxial capacitors to enable the resonator to be tuned by a trombone adjustment of its length.

Referring now to FIG. 3b, there is disclosed an RF surface coil 10 constructed in accordance with the principles of the present invention. The coil is rectangular in overall shape and comprises a left hand section 12 and a right hand section 14, as viewed in the drawing. Each section may be fabricated from conductive segments of suitable shape, such as, for example, linear, oval or circular forms. In the illustrated embodiment, the sections are formed of copper tubing.

Section 12 includes, as viewed in the drawing, an upper L shape member 16 and a lower L shape member 18. Member 16 includes a horizontal copper tubing 20 having its outer surface covered with a dielectric layer 22. Tubing 20 is integrally connected to downwardly disposed conductive tubing 24. Member 18 is constructed in a complimentary fashion and includes horizontally disposed copper tubing 26 having its surface covered with a suitable dielectric layer 27. One end of tubing 26 is connected to upwardly extending tubing 28. The tubing members 24 and 28 have their free ends slightly spaced from each other and a tuning capacitor 30 is connected across the gap.

It should be noted that use of terms such as top, bottom, left, right, horizontal, vertical, downward, upward are for descriptive purposes only with respect to the illustration of coil 10 as shown in the drawings and is not intended to imply any physical constraints to the invention other than the relative position of elements with respect to each other when the element is viewed with reference to the drawing.

Right hand section 14 also includes an upper L shape member 36 and a lower L shape member 38. Member 36 includes outer horizontal copper tubing 40 and an inner coaxial tubing 41 having at least a portion of its surface covered with a dielectric layer 42. Tubing 40 is integrally connected to a downwardly disposed conductive tubing 44. Lower member 38 is constructed complimentary to upper member 36 and includes horizontally disposed copper tubing 46. Within tubing 46 is coaxially supported a conductive tube 48 of a smaller dimension and having a dielectrical layer 49 at least covering a portion of its outer surface. The tubing members 36 and 38 are disposed with their ends closely spaced to each other. Connected across the gap between the ends of tube 36 and 38 is a tuning capacitor 50. Signals developed in coil 10 are coupled to coax line $C_o$ via coupling capacitor 51 which together with capacitor 50 matches the input and impedance of the coil 10 to that of the coax lines $C_o$.

As shown in FIG. 3a, the dimensions of the elements forming the coil are such that tubing 20 and 24 of the left section 12 slidingly fit within tubing 40 and 46 of the right hand section 14 and about tubing 41 and 48 positioned within the outer tubes 40 and 46 respectively. The free ends of tubings 20 and 24 pass freely between the inner surface of tubing 40 and 46, respectively, and the outer surface tubing 41 and 48, respectively, and its associated dielectric layers. To this end, tubing 20 and 24 may have a diameter of ⅜ (0.95 cm) in which case tubing 41 and 48 is of a smaller diameter, for example, $\theta$ (0.64 cm), while tubing 40 and 46 is of a diameter larger than that of tubing 20 and 26, for example ½ (1.27 cm). Inner tubes 41 and 48 are supported to the outer members 40, 36 and 46, 38 respectively nylon by fasteners. As shown, three physical restraints 54, 55, and 56 are utilized to retain the upper tube 41 in its extended position. Likewise, physical restraints 57, 58 and 59 are utilized to retain the lower tube 48 in its extend position. Other forms of restraint may also be used. For example, a non-conductive disc about tubes 41 and 48 may be utilized to support the free ends within tubular members 40 and 46. It is only required that each disc not be positioned where they would impede axial movement of members 20 and 26.

Coil 10 can be adjusted from about 12.5×17.5 cm to about 12.5×32.5 cm and is made from ½ (1.27 cm), ⅜ (0.95 cm) and ¼ (0.635 cm) tubular copper. Adjustment of the coil results in a variation of the inductance and capacitance of the probe to maintain an approximately constant resonant frequency over a considerable range of size adjustment.

Figure 4:
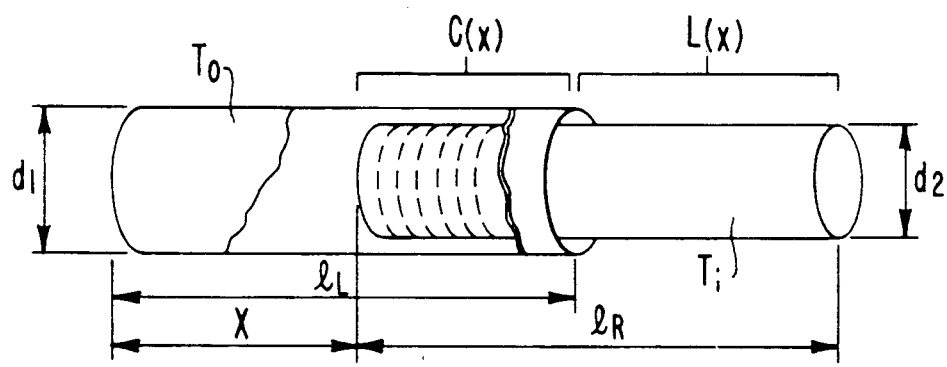
FIG. 4 is a diagrammatic illustration of simple trombone segment of an RF coil in accordance with the present invention with a portion of the outer tube removed for clarity and showing various axial positions of the tubular member.

The following analysis assumes that coil dimensions are small enough to ignore wavelength effects and negligible resistance in the coil. FIG. 4 indicates a simple trombone section identifying some of variable qualities which are relevant in analyzing the effect on resonance due to positioning of the coaxial tube $T_i$ along the outer tube $T_o$. It can be seen that the inner tube will exert a capacitive effect $C_{(x)}$ as a function of the extent of the tube that lies within the outer tube $T_o$, while the inductance $L_{(x)}$ is a function of the extent of tube $T_o$ which lies outside of tube $T_i$.

Figure 5:
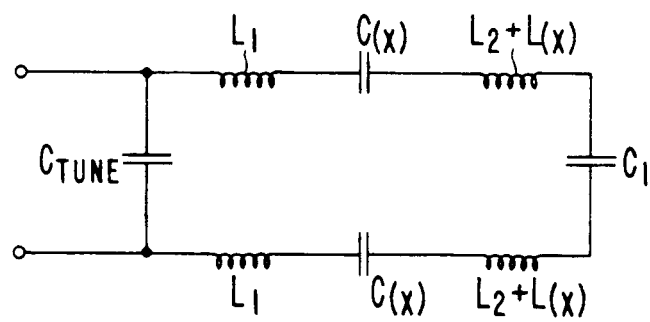
FIG. 5 is an electrical circuit model of the adjustable coil shown in FIG. 3.
Figure 6:
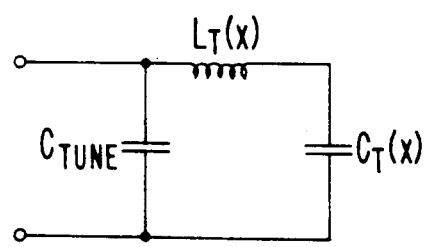
FIG. 6 is simplified schematic diagram of the electrical circuit model of FIG. 5.

FIG. 5 shows a circuit model of the adjustable coil and FIG. 6 shows a simplified version of the circuit model. For constant tuning, the equivalent inductance $L_{eq}$ must be a constant, where $$j\omega L_{eq} = j\omega L_T(x) - j1/\omega C_T(x) \tag{4}$$

and $$\omega = \frac{1}{\sqrt{L_{eq} C_{Tune}}} \tag{5}$$

For the case of a single trombone, schematically shown in FIG. 3, the following equations approximately apply:

$$L(x) = 1.97(10^{-7}) \times [\ln(4x/d_2) + d_2/2X - .75] \text{ H} \tag{6}$$

$$C(x) = \frac{2\pi\epsilon_0 \epsilon_r (l - x)}{\ln(d_1/d_2)} \text{ F}$$

where linear dimensions are in meters and SI units are used for $\epsilon_0$, the permittivity of free space and $\epsilon_r$, the relative permittivity for the dielectric, H is in henry's and F is in farad. Also, $$C_T(x) = \frac{C_1 C(x)}{c(x) + 2C_1} \tag{7}$$

and $$L_T(x) = 2[L_1 + L_2 + L(x)].$$

In order to satisfy the equation $L_{eq} = L_T(x) - 1/\omega^2 C_T(x) = \text{const.}$, $C(x)$ and/or $L(x)$ must be variable. As can be seen from the equations above, for the unmodified trombone, to make $L_{eq}$ a constant, $\epsilon_r$, must vary as a function of x to give $L_T(x)$ and $1/\omega^2 C_T(x)$ equal derivatives in x. By slightly modifying the trombone, a constant $L_{eq}$ can be attained in several different ways.

It has been found, for a coil 10 constructed as shown in FIG. 3b, that the capacitance of the system decreases rapidly (the resonant frequency increases) as the tubes are extended and the coil is enlarged. Two approaches have been developed for compensating for such rapid increase in resonant frequency.

Figure 7:
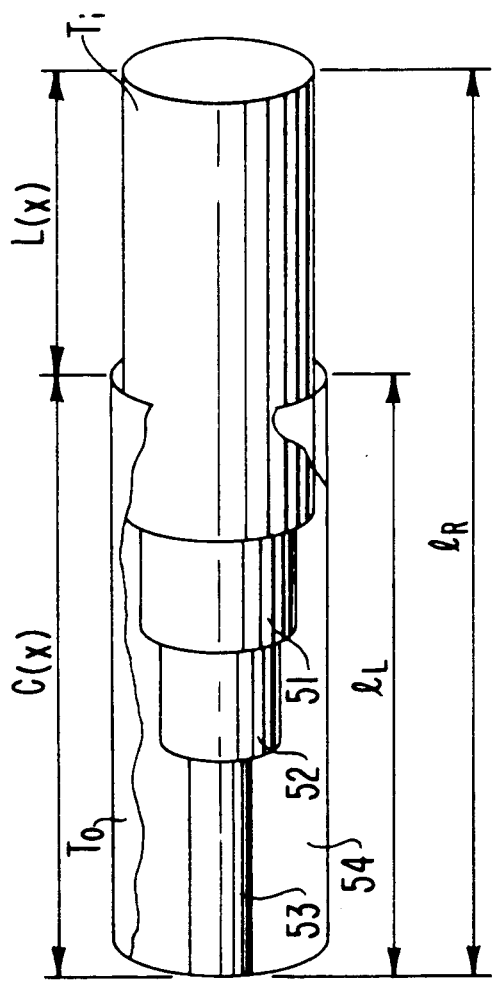
FIG. 7 is a diagrammatic illustration of a trombone segment incorporating a telescoping conductors in accordance with the present invention and with a portion of the outer tube removed clarity.

In one embodiment, a set of telescoping conductors similar to the radio antenna of an automobile, is utilized as shown in FIG. 7. FIG. 7 shows only a simplified version of one leg. The other leg is of course identical in construction. It can be observed that the rate of decrease in capacitance is slowed with this construction where the inner tubing includes a plurality of stepped sections because the capacitive effect $C_{(x)}$ will vary for each section depending on the space between the surfaces. $S_1$, $S_2$, $S_3$, and the inner surface $S_4$ to tube $T_o$. One can vary the diameter and length of each segment to make the resonant frequency approximately constant (within the Q bandwidth) over the range of size variation desired.

Figure 8:
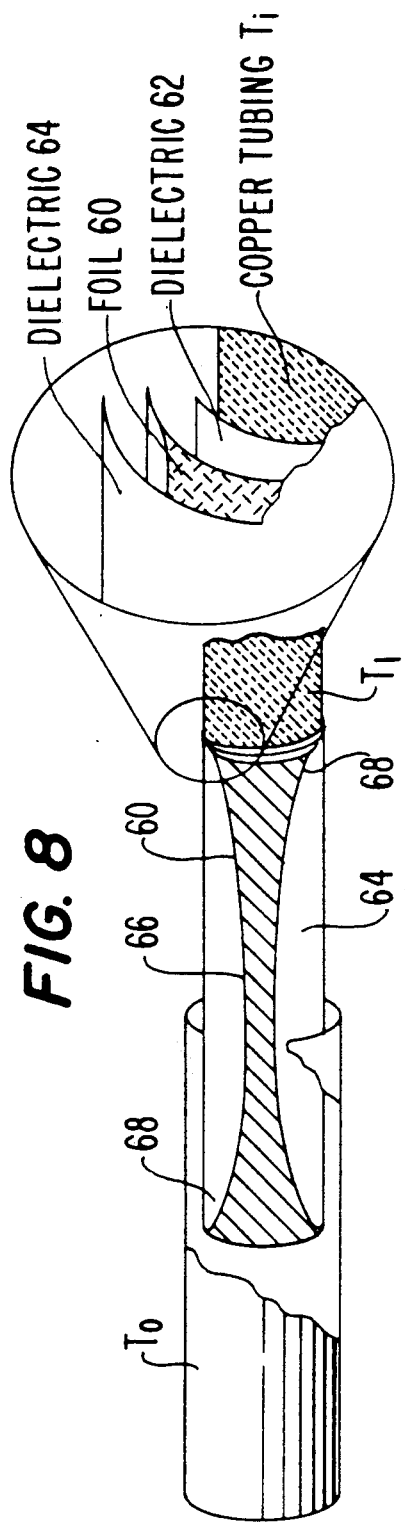
FIG. 8 is diagrammatic representing of a coil in accordance with the present invention showing use of a shaped conductive layer that compensates for impedance change with length, with an enlarged view of the several layers and with a portion of the outer tube removed for clarity.

An alternative embodiment is shown in FIG. 8 a conductive layer 60 of copper foil is positioned between layers 62 and 64 of dielectric. This foil can easily be trimmed or shaped to compensate for the fast decrease in capacitance which would otherwise occur upon extension of the trombone sections. As shown in FIG. 8, this inner tube $T_i$ has an end section which is covered with a dielectric layer 62. Layer 62 is in turn covered with a conductive foil layer 60 which is trimmed or shaped to provide the desired capacitive effect, i.e. to compensate for a fast decrease in capacitance upon extension of the coil dimensions.

In the embodiment shown in FIG. 8, the coil has been trimmed by cutting away a section leaving an area 66 which is narrow in width at the center and gradually and continually increasing in width outwardly as at 68 away from the center. At the end of the conductive section 60, the largest extent 68 wraps around the tube. From FIG. 8, it can be seen that, in effect, a section of foil has been removed from between the two dielectric layers which creates a gap between the dielectric layers which gradually decreases in width from the free end of tubing $T_1$ towards the center and then increases in width until the start end of the dielectric.

It should be apparent that only one side of tube $T_i$ and the cutaway foil section is shown. The cutout is repeated on the opposite side. Also, it will be obvious to those skilled in the art that the shape of the cutout may be selectively changed to control the change in capacitance and maintain the resonant frequency of the coil constant. FIG. 9 shows empirical results for an RF coil constructed in accordance with the present invention using a normal trombone, one sliding inner conductor, and an inner conductor plus a piece of foil tape of a particular shape. The results demonstrate that the change in resonance frequency with change in coil size can be made negligible with appropriate modifications. The ordinary trombone comprising two axial conductors is represented by curve A and illustrates the rapid increase in resonance frequency of the coil (decrease in capacitance of the system) as the coil is enlarged. The frequency, while relatively constant for extensions of 3 cm or less, rapidly rises for greater extensions. Using a 3 coaxial conductor coil, as shown in FIG. 3a, the resonant frequency variation for a 10 cm change in length of the coil is limited to about 3 Mhz as shown by curve B. When a foil layer is utilized, as in the example of FIG. 8, a further reduction in increase in resonant frequency is obtained. With this particular configuration, the resonant frequency exhibits a slight change at both ends, that is when the slidable segment is fully inserted as well as when fully extended. However, the overall change for full travel of the coil is approximately 2 Mhz.

The embodiments of FIGS. 7 and 8 can be used separately or combined to obtain the desired result.

The possible applications of the basic idea are numerous. Any probe which has a linear or circular cross-sectional segment can be fabricated as a trombone impedance coil. Varactor diodes could be added to further maintain a constant resonant frequency, however, this would require additional control circuitry. Adjustments of the trombone could be varied remotely with hydraulic or pneumatic devices or motors.

While a single loop coil has been described, it is also possible to employ two coupled loops, producing splitting of the resonant peak dependent upon the separation of the two loops. By utilizing the above modified trombone approach, the coupling could be varied while forcing the peak of interest to remain at a constant frequency. This could be applied to any helmholtz pair where the distance between the two loops is variable (as in cardiac applications).

In the case of the rectangular coils as described herein, a series of spine images with different fields-of-view can easily be made without switching to different coils or retuning for each image. This is especially convenient if one has a "pizza-oven" [Williamson, M. R., Angtuaco, E. J., Jackson, J. C., and Pruitt, W. B., *Radiolooy* 167, 273-274 (1988)] apparatus which allows repositioning of the coil without moving the patient.

While the subject invention is quite useful in most applications, they should be particularly suited to clinical applications where changing the field of view typically requires moving the patient to introduce a different size surface coil.

While this invention has been described with reference to particular embodiments and examples, other modifications and variations will suggest themselves to those skilled in the art in view of the foregoing description. Accordingly, it is intended to cover all such modifications and variations which come within the scope of the appended claims.

What is claimed:

1. An NMR radio-frequency (RF) surface coil comprising first and second conductive sections, each said first and second conductive sections including a pair of conductive tubular legs, the conductive legs of said first and second sections being coaxial and the legs of said first section being received within the legs of said second section;

said legs of said first section including a first dielectric layer covering at least a portion of the legs received within the legs of the second section, means for supporting said first and second sections in a rectangular coil configuration such that the legs of said first section are slidingly positionable within the legs of said second section to thereby provide a variable field of view for said coil.

2. The NMR radio frequency (RF) coil as set forth in claim 1 further including a conductive layer on said first dielectric layer and a second dielectric layer on said conductive layer.

3. The NMR radio frequency (RF) surface coil as set forth in claim 2 wherein said conductive layer is of a predetermined shape for controlling the resonant frequency of said coil upon repositioning of the legs of the first section.

4. The NMR radio frequency (RF) surface coil as set forth in claim 1, 2 or 3 wherein the legs of said first section include stepped surfaces along the length to thereby provide a variable spacing between the inside surface of the outside legs of the second section and the outside surface of the legs of the first section.

5. The NMR radio frequency coil as set forth in claim 1, 2 or 3 wherein the legs of said first section include a telescoping member.

6. The NMR radio frequency coil as set forth in claim 1 further including capacitor means electrically connected between the legs of each said first and second sections.

7. The NMR radio frequency (RF) surface coil as set forth in claim 3 wherein said conductive layer is shaped to maintain the resonant frequency of the coil substantially constant upon changes in shape of the coil due to repositioning of the legs of the first section.

8. An NMR radio frequency (RF) surface coil comprising:

first and second conductive sections, said first conductive section including a pair of tubular legs, said second conductive section including a pair of tubular legs, each said leg of said second conductive section comprising an outer cylindrical member and an inner cylindrical member spaced therefrom, means for supporting each said inner cylindrical member within an associated outer member;

said tubular legs of said first section being slidably received and positionable within the legs of the second section to provide a rectangular coil configuration adjustable in size to provide a variable field of view for said coil.

9. An NMR radio frequency (RF) surface coil as set forth in claim 8 wherein the tubular legs of said first section include a first dielectric layer covering at least a portion of the surface of the legs received within the second section.

10. An NMR radio frequency (RF) surface coil as set forth in claim 9 further including a conductive layer on said first dielectric layer and a second dielectric layer on said conductive layer.

11. An NMR radio frequency (RF) surface coil as set forth in claim 10 wherein said conductive layer is of a predetermined shape.

12. An NMR radio frequency (RF) surface coil as set forth in claims 9, 10, or 11 wherein the legs of said first section include stepped surfaces along the length to thereby provide a variable spacing between the inside surface of the outside legs of the second section and the outside surface of the legs of the first section.

13. An NMR radio frequency (RF) surface coil as set forth in claims 9, 10 or 11 wherein the legs of said first section include a telescoping member.

14. An NMR radio frequency (RF) surface coil as set forth in claim 9 including capacitor means electrically connected between the legs of each said first and second sections.

15. An NMR radio frequency (RF) surface coil as set forth in claim 11 wherein said conductive layer is shaped to maintain the resonant frequency of the coil substantially constant upon changes in shape of the coil due to repositioning of the legs of the first section.

* * * * *

UNITED STATES PATENT AND TRADEMARK OFFICE
CERTIFICATE OF CORRECTION

PATENT NO. : 5,049,821
DATED : September 17, 1991
INVENTOR(S) : George R. Duensing, et. al.

It is certified that error appears in the above-identified patent and that said Letters Patent is hereby corrected as shown below:

On the Title page, the heading "United States Patent" item [19] insert -- Fitzsimmons et al. -- and delete "Duensing et al."

On the Title page, item [75] Inventors: replace George R. Duensing; Jeffrey R. Fitzsimmons" with -- Jeffrey R. Fitzsimmons; George R. Duensing --

Signed and Sealed this

Twenty-ninth Day of December, 1992

*Attest:*

DOUGLAS B. COMER

*Attesting Officer*   Acting Commissioner of Patents and Trademarks